United States Patent [19]

Hughes et al.

[11] Patent Number: 5,348,605
[45] Date of Patent: Sep. 20, 1994

[54] TILTING BUCKET ASSEMBLY FOR PHOTOPOLYMER PLATEMAKING

[75] Inventors: Norman E. Hughes, Landenberg, Pa.; Richard B. Schroeder, Wilmington, Del.

[73] Assignee: Hercules Incorporated, Wilmington, Del.

[21] Appl. No.: 120,839

[22] Filed: Sep. 15, 1993

[51] Int. Cl.⁵ .................. B32B 31/00; B67D 5/64; B05C 19/02
[52] U.S. Cl. .................. 156/275.5; 156/356; 156/379.6; 156/575; 222/166; 118/413; 118/421; 118/429; 430/300
[58] Field of Search .................. 156/575, 578, 71, 246, 156/275.5, 356, 379.6, 500, 577; 222/164, 166; 118/421, 429, 413; 427/508, 510; 430/300

[56] References Cited

U.S. PATENT DOCUMENTS

| | | |
|---|---|---|
| 3,556,791 | 1/1971 | Suzuki et al. .................. 96/35.1 |
| 3,687,785 | 8/1972 | Akamatsu et al. . |
| 3,751,164 | 8/1973 | Miller et al. . |
| 3,837,887 | 9/1974 | Akamatsu et al. . |
| 3,848,998 | 11/1974 | Yonekura et al. . |
| 3,971,691 | 7/1976 | Cairns . |
| 4,056,423 | 11/1977 | Hughes . |
| 4,070,110 | 1/1978 | Ott . |
| 4,087,182 | 5/1978 | Aiba et al. . |
| 4,137,081 | 1/1979 | Pohl . |
| 4,214,942 | 7/1980 | Inoko et al. .................. 156/575 |
| 4,239,821 | 12/1980 | McLean et al. .................. 118/413 |
| 4,266,007 | 5/1981 | Hughes et al. . |
| 4,383,759 | 5/1983 | Bloothoofd et al. . |
| 4,403,566 | 9/1986 | Bloothoofd . |
| 4,450,226 | 5/1984 | Bloothoofd . |
| 4,475,810 | 10/1984 | Schroeder . |
| 4,638,758 | 1/1987 | Bloothoofd . |
| 5,114,527 | 5/1992 | Stern et al. .................. 118/413 |

FOREIGN PATENT DOCUMENTS 43-19125 8/1968 Japan .

OTHER PUBLICATIONS

Derwent Abstract, p. 5, vol. 7, No. 33 (1968).

Primary Examiner—Chester T. Barry
Attorney, Agent, or Firm—Robert O'Flynn O'Brien

[57] ABSTRACT

Photopolymer platemaking apparatus comprises a tilting bucket assembly comprising a tilting bucket having a lip, a substantially vertical wall associated with the tilting bucket, and positioning means for maintaining the lip in contact with a substantially vertical wall during tilting of the tilting bucket from an upright position to a pre-pouring position, and for separating the lip from the substantially vertical wall as the tilting bucket tilts from the pre-pouring position to a pouring position. Preferably, the positioning means additionally moves the tilting bucket from the pouring position to the post-pouring position, and from the post-pouring position to the upright position, and maintains the lip in contact with the substantially vertical wall during movement of the tilting bucket from the post-pouring position to the upright position.

35 Claims, 8 Drawing Sheets

TILTING BUCKET ASSEMBLY FOR PHOTOPOLYMER PLATEMAKING

BACKGROUND OF THE INVENTION

1. Field of the Invention

The present invention relates to apparatus for making photopolymer printing plates, and processes for making photopolymer plates using the apparatus. More specifically, the invention relates to a tilting bucket assembly for use in photopolymer platemaking apparatus, and processes of using same in the making of photopolymer printing plates.

2. Description of Background and Other Information

In the past, processes and apparatus have been developed which apply a liquid photocurable polymer to a support surface, these apparatus providing means for leveling the applied composition to provide a substantially uniform thickness of composition over the support surface.

U.S. Pat. No. 3,837,887 (AKAMATSU et al., '887) relates to a process for the preparation of printing plates of photopolymer resin, and discloses an apparatus which supplies a photopolymer liquid resin onto a support surface, and doctors the resin while simultaneously pressing a plastic backing sheet over and on the doctored surface of the resin.

U.S. Pat. No. 3,751,164 (MILLER et. al. '164) relates to an automated apparatus for photocomposing, and discloses a constant pressure dispensing manifold having nozzles to dispense at a uniform rate.

U.S. Pat. No. 3,848,998 (YONEKURA et al. '998) relates to an apparatus for the production of photopolymer plates, and discloses apparatus comprising means for applying a liquid photosensitive material onto a protective film.

U.S. Pat. No. 4,056,423 (HUGHES '423) relates to platemaking apparatus comprising a substantially vertical wall to assist pouring and having a lower portion which serves as a doctor blade for uniformly spreading the photopolymer. The apparatus also comprises a scoop which is moveable with respect to the vertical plate to discharge the photopolymer at a controlled rate, with the entire assembly being part of a movable carriage which traverses the length of a platemaking machine.

U.S. Pat. No. 4,383,759 (BLOOTHOOFD et al. '759), relates to method and apparatus for producing a capped printing plate, and discloses uniform layers of two liquid photopolymerizable materials for a capped (i.e., two layer) printing plate. The apparatus comprises a dual manifold which spans the plate-forming area of a surface, and is moved in tandem transversely in order to provide two overlapping layers of liquid photopolymerizable materials.

SUMMARY OF THE INVENTION

The present invention relates to a tilting bucket assembly. The tilting bucket assembly comprises:

a tilting bucket having a lip thereon;

a substantially vertical wall associated with the tilting bucket;

positioning means for maintaining the lip in contact with the substantially vertical wall during tilting of the bucket from an upright position to a pre-pouring position, and for separating the lip from the substantially vertical wall as the bucket tilts from the pre-pouring position to a pouring position.

Preferably, the positioning means additionally moves the tilting bucket from the pouring position to the post-pouring position, and from the post-pouring position to the upright position, and maintains the lip in contact with the substantially vertical wall during movement of the tilting bucket from the post-pouring position to the upright position.

Preferably, the substantially vertical wall has a lower edge which serves as a doctor blade.

Preferably, the tilting bucket assembly further comprises means for controlling a rate of pouring of a liquid resin from the tilting bucket, so that a uniform flow of the liquid resin can be provided on a surface of a film.

Preferably, the tilting bucket is moveable laterally towards and away from the substantially vertical wall.

Preferably, at the pouring position there is a gap between the lip and the substantially vertical wall of from about 0.02 inch to 2 inches, as the bucket tilts from the pre-pouring position to the pouring position. More preferably, at the pouring position there is a gap between the lip and the substantially vertical wall of from about 0.1 inch to 1 inch, as the bucket tilts from the pre-pouring position to the pouring position. For making photopolymer capping plates, it is still more preferred that at the pouring position there is a gap between the lip and the substantially vertical wall of from about 0.2 inch to 0.3 inch, as the bucket tilts from the pre-pouring position to the pouring position. For making relatively thick photopolymer plates, it is still more preferred that at the pouring position there is a gap between the lip and the substantially vertical wall of from about 0.4 inch to 0.8 inch, as the bucket tilts from the pre-pouring position to the pouring position.

In a first preferred embodiment, the means for maintaining the lip in contact with the substantially vertical wall during tilting, for separating the lip from said substantially vertical wall, and for maintaining the lip in contact with said substantially vertical wall during moving, comprises a hanger assembly comprising a pair of side plates comprising opposing traverse slots, a pair of opposing, outwardly extending traverse hanger pins, each of the traverse slots having one of the pair of opposing hanger pins positioned therein, each of the side plates further comprising a pair of inwardly extending stop pins. Preferably the means for maintaining the lip in contact with the substantially vertical wall further comprises one or more springs biasing the lip against the substantially vertical wall.

In a second preferred embodiment, the means for maintaining the lip in contact with the substantially vertical wall during tilting, for separating the lip from the substantially vertical wall, and for maintaining the lip in contact with the substantially vertical wall during moving, comprises a hanger assembly comprising a pair of side plates each comprising two traverse slots, each of the traverse slots having a traverse hanger pin positioned therein, and two pairs of opposing, outwardly extending traverse hanger pins.

The present invention further pertains to a photopolymer platemaking apparatus comprising the tilting bucket assembly described above, the photopolymer platemaking apparatus further comprising a horizontal flat plate and a press roll.

Preferably, the photopolymer platemaking apparatus further comprises a photo transparency on the flat plate, a cover film on the photo transparency, and a movable carriage for traversing the flat plate with the tilting bucket assembly being mounted on the moveable carriage, means for rolling a backing sheet into a photosensitive liquid resin layer. Preferably, the tilting bucket assembly, the press roll, and the substantially vertical wall are mounted on the movable carriage. Preferably, the substantially vertical wall has a lower edge serving as a doctor blade.

Preferably, the photopolymer platemaking apparatus further comprises means for controlling the speed of movement and the amount of movement of the lip with respect to the substantially vertical wall, and for controlling a gap between the lip and the substantially vertical wall, so that a uniform flow of a photosensitive liquid resin is provided onto a surface of the cover film. A lower edge of the substantially vertical wall doctors the photosensitive liquid resin to a substantially uniform thickness (i.e., layer) before an application of the backing sheet to the doctored photosensitive liquid resin layer.

Preferably, a shim is positioned above at least a portion of the flat plate. The press roll rides on the shim. The height of the press roll from the flat plate is determined by the thickness of the shim. Means for driving the carriage comprises gearing connected to the press roll and the flat plate, pivotally mounted to the carriage, and vertically adjustable for a height of the press roll from the flat plate.

The present invention also pertains to a process for preparing a photopolymeric printing plate from a photosensitive liquid resin. The process comprises (A) tilting a tilting bucket containing the photosensitive liquid resin, the tilting bucket having a lip thereon, while maintaining the lip in contact with a substantially vertical wall during tilting of the tilting bucket from an upright position to a pre-pouring position;

(B) separating the lip from the substantially vertical wall as the tilting bucket is further tilted from the pre-pouring position to a pouring position; and (C) maintaining the tilting bucket in the pouring position during pouring of the photosensitive liquid resin onto a supporting surface.

Preferably, the process further comprises:

(D) moving the tilting bucket from the pouring position to a post-pouring position; and (E) moving the tilting bucket from the post-pouring position to the upright position while the lip remains in contact with the substantially vertical wall.

Preferably, the process further comprises:

doctoring the photosensitive liquid resin on the supporting surface using a predetermined clearance from the supporting surface, to produce a doctored photosensitive liquid resin layer;

laminating a backing sheet onto the doctored resin layer to form an assembly of the backing sheet and the doctored photosensitive liquid resin layer;

exposing the assembly to actinic radiation through an image-bearing transparency, so that exposed portions of the photosensitive liquid resin layer are polymerized; and removing non-exposed, unpolymerized portions of the layer of photosensitive material, to form relief images on the backing material.

Preferably, the process is carried out so that the tilting bucket assembly supplies the photosensitive liquid resin over the supporting surface without substantial bubble formation in the photosensitive liquid resin.

Preferably, the moving of the bucket from the post-pouring position to the upright position recaptures at least 60%, more preferably at least 80%, and still more preferably, at least 90%, of an amount of the photosensitive liquid resin remaining on the substantially vertical wall after the photosensitive liquid resin is supplied over the supporting surface.

Preferably, the process utilizes the preferred tilting bucket assembly, and preferred photopolymer platemaking apparatus, as described herein.

It is an objective of the present invention to provide a tilting bucket assembly in which a "top-pouring" bucket, containing photosensitive liquid resin, can be poured therefrom without substantial bubble formation in the resin during pouring of the resin from the bucket onto a cover film positioned over a photo transparency. Bubble formation is highly undesirable because it produces locations of physical weakness in the resulting printing plate, and frequently results in defects in image production by the resulting printing plate. Furthermore, a top-pouring bucket provides the advantage of allowing the use of a plurality of exchangeable buckets, to permit efficient switching of one resin type for another. Top-pouring buckets permit the use of a mere portion of the contents therein, and can also be stored with polymer therein, unlike bottom opening buckets as disclosed in HUGHES '423.

Furthermore, the top-pouring bucket, when utilized in the tilting bucket assembly of the present invention, permits a substantially bubble-free pour to occur, thereby avoiding the problems caused by the presence of bubbles, while obtaining the above-described advantages of a top-pouring bucket rather than a bottom-opening bucket, as disclosed HUGHES '423. Unlike the bottom-opening bucket, which utilizes a pneumatic opening means, the tilting bucket assembly of the present invention can be manually tilted, and thereby need contain only one moving part, i.e., the tilting bucket itself.

It is a further objective of the present invention to recapture photosensitive liquid resin which remains on the substantially vertical wall after pouring is completed. This objective is accomplished by maintaining the lip against the substantially vertical wall, as the tilting bucket is moved from the post-pouring position to the upright position. Recapturing this excess photosensitive liquid resin conserves resin, produces easier cleanup of the platemaking apparatus, and reduces unwanted dripping of photosensitive liquid resin from the substantially vertical wall after a desired amount of resin has been deposited on the supporting surface.

BRIEF DESCRIPTION OF THE DRAWINGS

The above and additional objects, characteristics, and advantages of the present invention will become apparent in the following detailed description of preferred embodiments, with reference to the accompanying drawings which are presented as non-limiting examples, in which.

DESCRIPTION OF THE INVENTION

Figure 1:
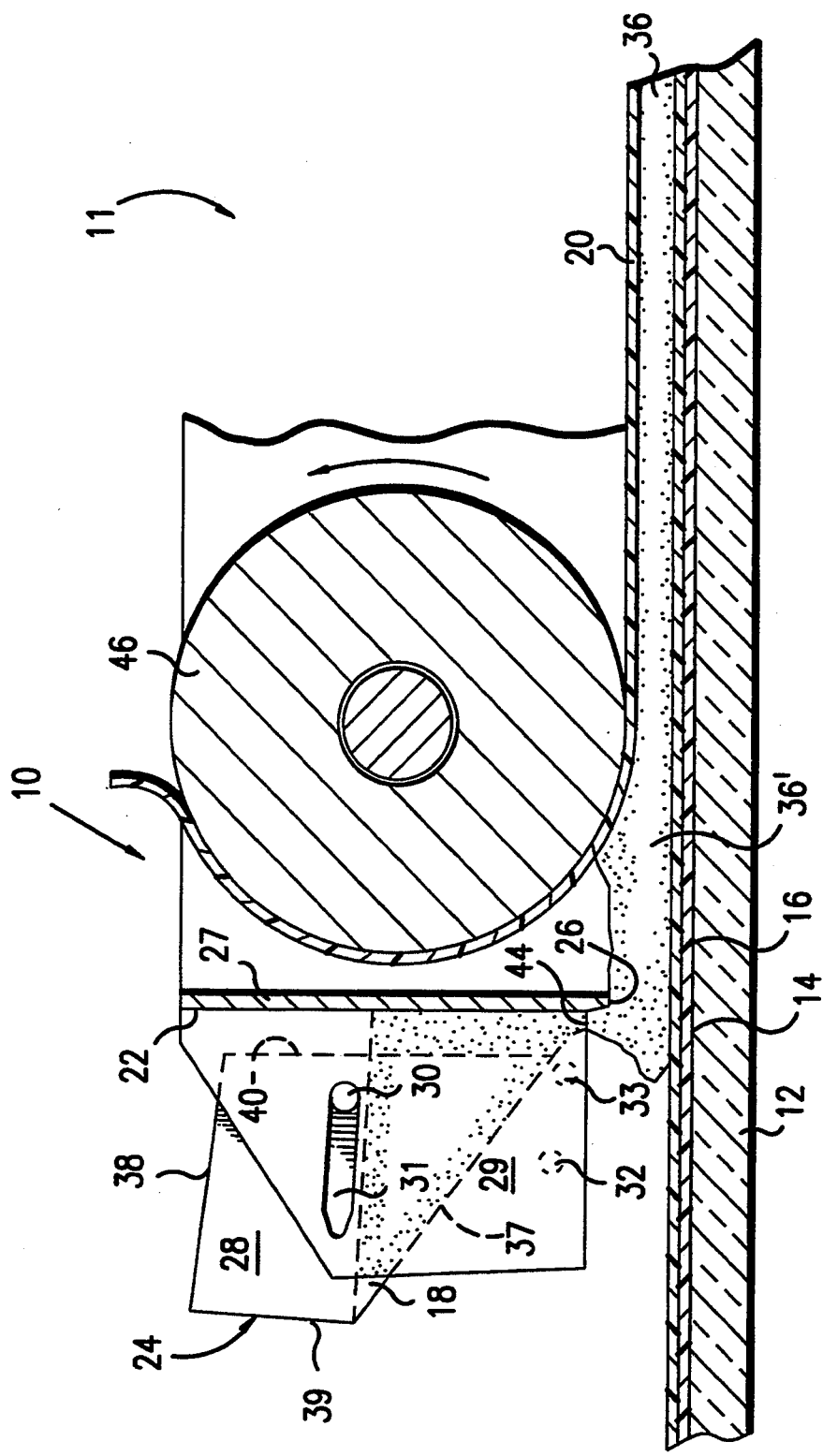
FIG. 1 is a cross-sectional view of a front side of a preferred photopolymer platemaking apparatus of the instant invention.

As used herein, the word "tilting" is used with reference to both the tilting the bucket from an upright position to a pre-pouring position, as well as the tilting of the bucket from the pre-pouring position to a pouring position.

As used herein, the word "moving" is used with reference to both the moving of the bucket from the pouring position to a post-pouring position, as well as the moving of the bucket from the post-pouring position to the upright position.

As used herein, the phrase "top-pouring bucket" refers to a bucket comprising a bucket bottom and bucket side walls integral therewith, and having an open top. Top-pouring buckets are tilted in order to pour liquid contents from the top thereof.

As used herein, the phrase "without substantial bubble formation" refers to pouring liquid resin from the bucket onto the support surface without forming visibly-detectable bubbles in the resin during pouring. Avoiding the formation of visibly-detectable bubbles assists in ensuring that the resulting printing plate has desired imaging and structural integrity characteristics.

Describing now the drawings, it is to be understood that for purposes of simplicity, only enough of the construction of the apparatus and process of the present invention have been depicted as needed for those skilled in the art to readily understand the underlying principles and concepts of the present invention. Since the Figures illustrate front and rear views of the apparatus of the present invention, it is to be understood that certain elements, for example, end plates, bucket end walls, traverse hanger pins, traverse slots, and stop pins, being substantially symmetrically positioned on both front and rear sides of the apparatus, are referred to jointly (i.e., with a reference numeral referring to both the front element and the corresponding, symmetrically-positioned rear element), unless otherwise stated.

As can be seen in FIG. 1, photopolymer platemaking apparatus 11 comprises carriage assembly 10 which traverses horizontal flat plate 12 from right to left, to produce a photopolymer printing plate. Horizontal flat plate 12 is preferably designed to remain rigid under conditions of use, is transparent, is preferably made of glass, has a flat upper surface, and is preferably either of uniform thickness or is mounted on an adjustable support so that the upper surface can be adjusted to be substantially horizontally positioned. Photo transparency 14 is positioned on horizontal flat plate 12 and is covered by cover film 16 for protecting photo transparency 14. Carriage assembly 10 traverses the photo transparency 14 and deposits (i.e., supplies) photosensitive liquid resin 18 over cover film 16 by depositing photosensitive liquid resin 18 onto the surface thereof, and thereafter doctors the deposited resin 18 to form a doctored photosensitive liquid resin layer 36'. Carriage assembly 10 also rolls backing sheet 20 over and onto the doctored photosensitive liquid resin layer 36', forming substantially uniform photosensitive liquid resin layer 36. Carriage assembly 10 further comprises plate 27 having substantially vertical wall 22. Plate 27 also includes lower edge 26, which is preferably tapered, serving as a doctor blade to level photosensitive liquid resin 18 as carriage assembly 10 traverses photo transparency 14.

Figure 2:
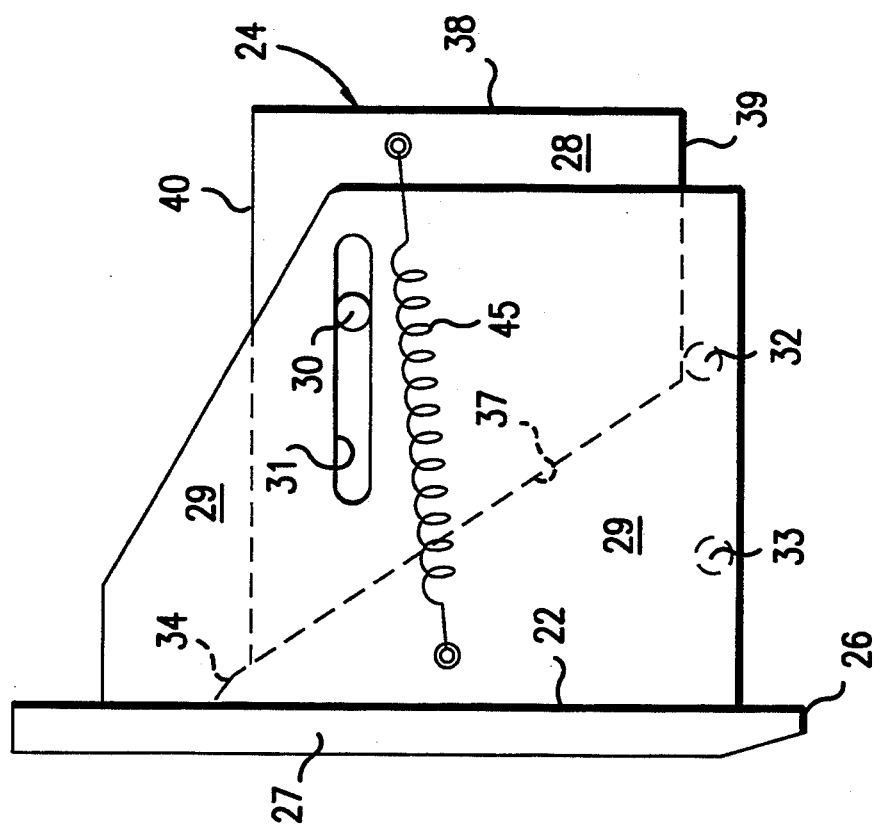
FIG. 2 is an enlarged cross-sectional view of a back side (i.e., rear) of the tilting bucket assembly illustrated in FIG. 1, shown in its upright position.
Figure 3:
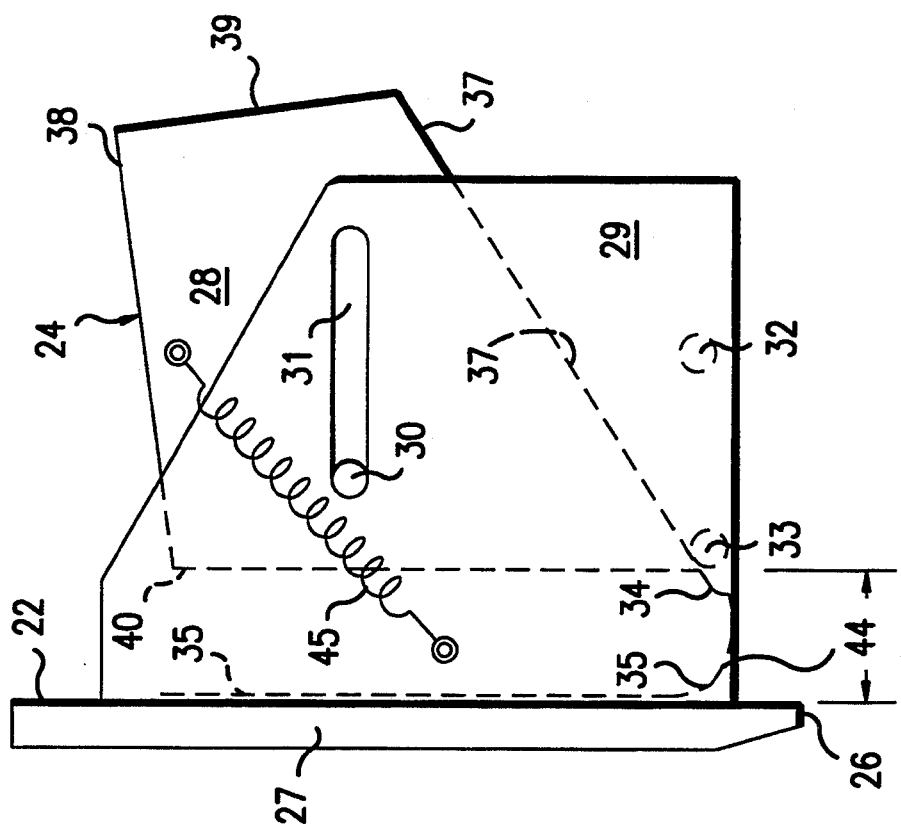
FIG. 3 is an enlarged cross-sectional view of a back side of the tilting bucket assembly illustrated in FIG. 1, shown in the pouring (i.e., fully tilted) position.
Figure 4:
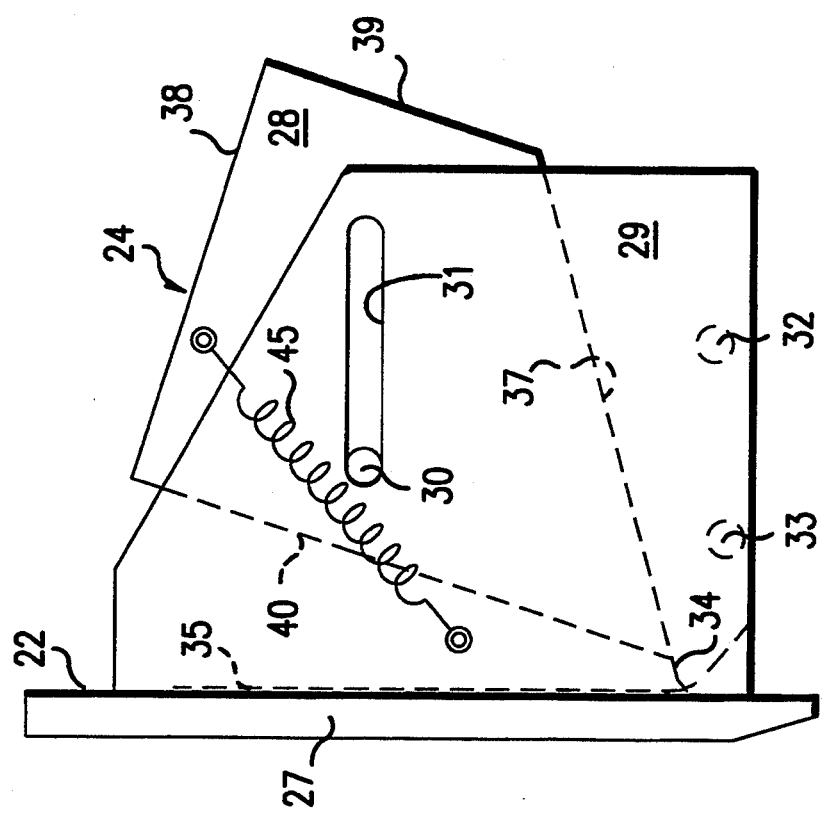
FIG. 4 is an enlarged cross-sectional view of a back side of the tilting bucket assembly illustrated in FIG. 1, shown in its pre-pouring and post-pouring positions.

In FIG. 2, tilting bucket 24, illustrated in its fully upright position, is open at the top, has four side walls (i.e., leading bucket wall 38, trailing bucket wall 37, and front and rear bucket end walls 28), bucket top 40 (which is open for the pouring of photosensitive liquid resin therefrom), and bucket bottom 39, and is positioned between front and rear end plates 29. Front end plate 29 is illustrated in FIG. 1, and rear end plate 29 is illustrated in FIGS. 2, 3, and 4. Although tilting bucket 24 is preferably made of stainless steel, it can be made from any material nonreactive with photosensitive liquid resin 18 (together with any additives included therewith, as discussed below), which is also suitable for such containers. End plates 29 are rigidly connected to plate 27, in order to assist in containing photosensitive liquid resin 18 when tilting bucket 24 is tilted from the upright position to the pre-pouring position, as illustrated in FIGS. 2 and 4, as well as from the pre-pouring position of FIG. 4 to the pouring position, as illustrated in FIG. 3.

Tilting bucket 24 is pivotally interconnected to front and rear end plates 29 via opposing, outwardly extending front and rear traverse hanger pins 30, which are rigidly secured to front and rear bucket end walls 28. Front and rear end plates 29 have therein opposing front and rear traverse slots 31, in which outwardly extending, opposing, front and rear traverse hanger pins 30, are positioned. Front and rear end plates 29 are also provided with front and rear stop pins, including front and rear inwardly extending, opposing upright stop pins 32 and, front and rear inwardly extending, opposing tilt stop pins 33.

Tilting bucket 24 is tiltable from an upright position (e.g., as illustrated in FIG. 2) to a pouring position (e.g., as illustrated in FIGS. 1 and 3). Although tilting bucket 24 can be manually tilted, means for automated tilting of tilting bucket 24 can also be provided. Such means for automated tilting is disclosed in HUGHES '423, the disclosure of which is hereby incorporated, in its entirety, by reference thereto. However, for use in the present invention, such an automated tilting means would be modified for the tilting of a top-pouring bucket, which is initially upright and therefore requires a much greater rotation angle than the amount of rotation required for the bottom-opening bucket (i.e., "scoop") disclosed in HUGHES '423. Such an automated tilting means for controlling a rate of pouring of photosensitive liquid resin layer 18 from tilting bucket 24 can further assist in the desirable objective of providing a uniform flow of photosensitive liquid resin onto cover film 16.

Trailing bucket wall 37 of tilting bucket 24 has an upper edge which terminates in extending lip 34. Although lip 34 is illustrated as extending above front and rear bucket end walls 28 and leading bucket wall 38, lip 34 need not extend above front and rear bucket end walls 28 or the leading bucket wall 38. However, lip 34 should be constructed and arranged so that it can be placed in substantially continuous contact with substantially vertical wall 22. With respect to substantially vertical wall 22, lip 34 is preferably substantially straight and substantially parallel to lower edge 26 of plate 27. Viewed from the end walls 28 of tilting bucket 24, lip 34 is preferably straight, or curved as illustrated in FIGS. 1-4. Lip 34 can be either one piece with tilting bucket 24, or attached to tilting bucket 24 as a separate piece. Furthermore, lip 34 can be of the same material as the bucket, e.g., steel, preferably stainless steel, or can be of a different material, e.g. polymeric or ceramic.

Tilting bucket 24 is one component of a tilting bucket assembly comprising means for: (1) maintaining the lip in contact with the substantially vertical wall during tilting of the tilting bucket from the upright position to a pre-pouring position, and during moving of the tilting bucket from a post-pouring position to the upright position; (2) separating the lip from the substantially vertical wall during tilting of the tilting bucket from the pre-pouring position to a pouring position, and during moving of the bucket from the pouring position to the post-pouring position. Although this means is exemplified by two different embodiments described below, still other configurations could be utilized to accomplish the same result.

Front and rear traverse slots 31, and front and rear traverse hanger pins 30, are arranged so that upon tilting of tilting bucket 24 from an upright position (illustrated in FIG. 2) to a pre-pouring position (illustrated in FIG. 4), lip 34 of tilting bucket 24 can be maintained against substantially vertical wall 22 during tilting, in order to prevent pouring of photosensitive liquid resin 18 before lip 34 reaches the pre-pouring position illustrated in FIG. 4. After reaching the pre-pouring position, continued further tilting of tilting bucket 24 from the pre-pouring position, illustrated in FIG. 4, to the pouring position, i.e. the fully tilted position as illustrated in FIGS. 1 and 3, results in separation of lip 34 from substantially vertical wall 22. That is, the construction and arrangement of front and rear traverse slots 31 and front and rear traverse hanger pins 30 permit tilting bucket 24 to be tilted with lip 34 against substantially vertical wall 22, so that photosensitive liquid resin 18 does not pour out between lip 34 and substantially vertical wall 22. The path of travel of lip 34 is illustrated by dotted line 35 which runs along and on substantially vertical wall 22, and moves off of substantially vertical wall 22 only at a bottom portion of the path of travel of lip 34. This permits the photosensitive liquid resin 18 to be poured only a relatively short distance before reaching protective cover film 16, and therebt minimizes bubble formation in photosensitive liquid resin 18 during pouring.

The tilting of bucket 24 from the pre-pouring position illustrated in FIG. 4 to the pouring position illustrated in FIG. 3, produces a gap 44 between lip 34 and substantially vertical wall 22, with photosensitive liquid resin 18 flowing through gap 44, down a short portion of substantially vertical wall 22, and onto and over protective cover film 16. In this manner, the pouring of photosensitive liquid resin 16 can be carried out from a top-pouring bucket, while being carried out substantially free of the formation of bubbles.

During pouring, carriage assembly 10 traverses protective cover film 16, with photosensitive liquid resin 18 being poured over protective cover film 16, thereafter being doctored by lower edge 26 of plate 27, to form doctored photosensitive liquid resin layer 36', following which backing sheet 20 is rolled over and onto doctored photosensitive liquid resin layer 36', by press roller 46, to result in substantially uniform photosensitive liquid resin layer 36 having backing sheet 20 thereover.

Once a desired amount of photosensitive liquid resin 18 is poured onto protective cover film 16, pouring of photosensitive liquid resin 18 is terminated by moving tilting bucket 24 from the fully-tilted position illustrated in FIG. 3 to a post-pouring position, also illustrated in FIG. 4, followed by further moving tilting bucket 24 to the upright position, illustrated in FIG. 2.

During moving of tilting bucket 24 from the post-pouring position to the upright position, lip 34 is maintained against substantially vertical wall 22 along the same path as during the tilting from the upright position to the pre-pouring position. This scrapes remaining photosensitive liquid resin 18 off of substantially vertical wall 22, thereby moving to tilting bucket 24 substantially all of the photosensitive liquid resin 18 recaptured from that portion of substantially vertical wall 22 which is scraped off by moving lip 34. Scraping off photosensitive liquid resin 18 from substantially vertical wall 22 also reduces drippage of photosensitive liquid resin 18 from substantially vertical wall 22, to assist in ensuring the uniformity of the resulting printing plate, and to reduce subsequent cleanup required of carriage assembly 10.

During tilting of tilting bucket 24 from the upright position to the pre-pouring position, photosensitive liquid resin 18 is prevented from pouring out between front and rear bucket end walls 28 and front and rear end plates 29, by a precision fit between front and rear bucket end walls 28 and front and rear end plate 29, respectively. The maximum tolerable size of any opening between these members is dependent upon the viscosity of the photosensitive liquid resin being poured, i.e., the opening can be larger for more viscous resins, without spillage through the opening during the plate-making operation. Preferably the front and rear end plates 29 are made from at least one member selected from a group consisting of high density polypropylene and polytetrafluoroethylene, and preferably the front and rear bucket end walls 28 press firmly against front and rear end plates 29, especially if the photosensitive liquid resin has a relatively low viscosity, i.e., from about 1 to 10,000 centipoise.

Figure 5:
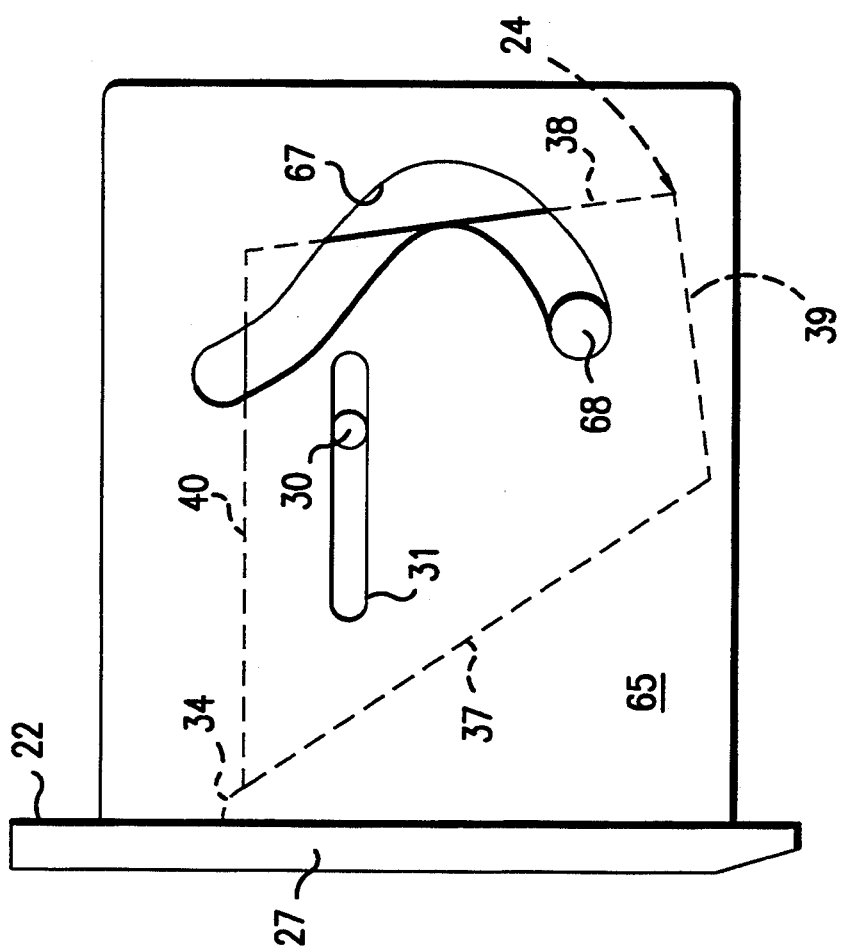
FIG. 5 is an enlarged cross-sectional view of a back side of an alternative embodiment of a tilting bucket assembly in accord with the present invention, shown in its upright position.
Figure 6:
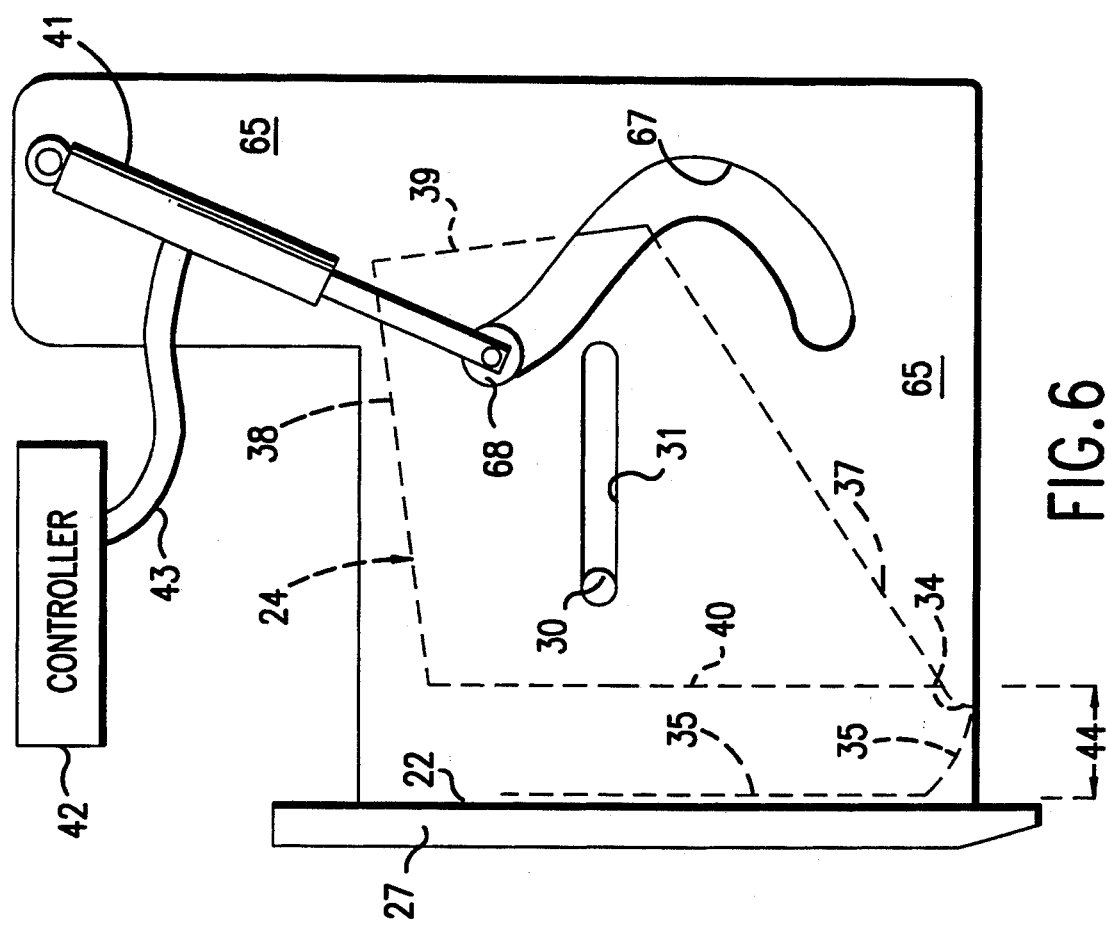
FIG. 6 illustrates an enlarged cross-sectional view of a back side of the tilting bucket assembly illustrated in FIG. 5, shown in the pouring position.
Figure 7:
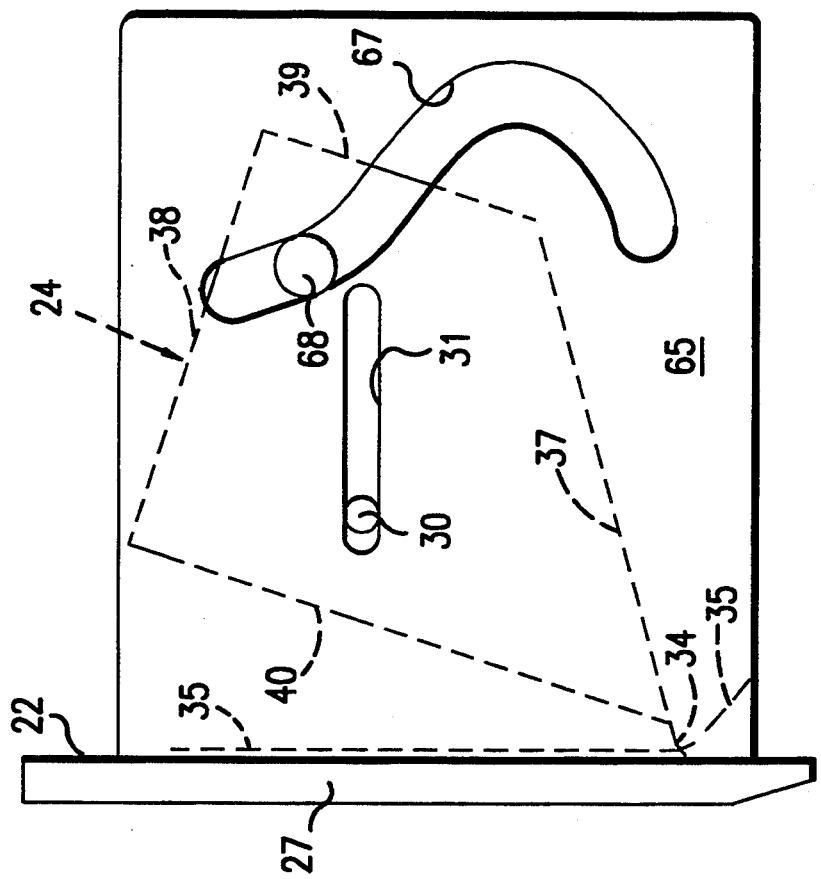
FIG. 7 illustrates an enlarged cross-sectional view of a back side of the tilting bucket assembly illustrated in FIGS. 5, shown in its pre-pouring and post pouring positions.

FIGS. 5, 6, and 7 illustrate a second embodiment of a tilting bucket assembly, in which the hanger assembly comprises front and rear side plates 65, each of which have two traverse slots, 31 and 67. Each of front and rear traverse slots 31 and 67 has positioned therewithin traverse hanger pin 30 and 68, respectively. Front and rear traverse hanger pins 30 and 68 are integral with front and rear bucket end walls 28 of tilting bucket 24.

Front and rear traverse slots 31 and 67, and corresponding front and rear traverse hanger pins 30 and 68, are arranged so that upon the tilting of tilting bucket 24 from an upright position (illustrated in FIG. 5) to a pre-pouring position (illustrated in FIG. 7), lip 34 of tilting bucket 24 can be maintained against substantially vertical wall 22 during tilting, in order to prevent pouring of photosensitive liquid resin 18 until lip 34 separates from substantially vertical wall 22, which separation occurs upon tilting from the pre-pouring position illustrated in FIG. 7 to the pouring position illustrated in FIG. 6. That is, the location of traverse slots 31 and 67, on front and rear end plates 29, and the location of front and rear traverse hanger pins 30 and 68, permits lip 34 of tilting bucket 24 to maintain contact with substantially vertical wall 22 as tilting bucket 24 is tilted from the upright position to the pre-pouring position, and as tilting bucket 24 is moved from the post-pouring position to the upright position. As illustrated in FIGS. 6 and 7, the path of travel of lip 34 is illustrated by dotted line 35, which runs on and along substantially vertical wall 22, and moves away from substantially vertical wall 22 only at a bottom portion of the path of travel 35 of lip 34. Likewise, during moving of tilting bucket 24 from the post-pouring position to the upright position, lip 34 is maintained against substantially vertical wall 22 along the same path of travel 35 as during tilting, to scrape photosensitive liquid resin 18 off of substantially vertical wall 22, thereby recapturing photosensitive liquid resin 18 and moving the recaptured photosensitive liquid resin 18 to tilting bucket 24. In this manner, this second embodiment of the tilting bucket assembly, as illustrated in FIGS. 5 and 6, is provided with the similar means as provided for the first embodiment as illustrated in FIGS. 1–4.

FIG. 6 also further illustrates an automated tilting means comprising servo mechanism 41 which can be activated manually, or can be activated automatically via controller 42 (preferably a computer) via line 43. The servo mechanism can be powered pneumatically, hydraulically, by an electric motor, etc. The automated tilting means can be utilized not only to tilt and move the tilting bucket assembly, it can also be used to control the size of gap 44, which can be constant throughout pouring or can change as a function of time, for example, based on the static head of liquid resin 18 above gap 44, with the size of gap 44 decreasing as the static head of liquid resin 18 decreases during pouring, in a manner to ensure a constant flow rate of liquid resin onto cover film 16.

The automated tilting means can be utilized in the embodiment illustrated in FIGS. 1–4, as well as the embodiment illustrated in FIGS. 5–7. With respect to the embodiment of FIGS. 1–4, preferably, the automated tilting means is attached to front and/or rear end plates 29 and front and/or rear bucket end walls 28 or leading bucket wall 38 or bucket bottom 39.

The embodiment illustrated in FIGS. 1–4 preferably utilizes front and rear springs 45, as illustrated in FIGS. 2, 3, and 4. Front and rear springs 45 are connected to end plates 29 and front and rear bucket end walls 28, in order to keep lip 34 against wall 22 during tilting and moving. In contrast, the embodiment illustrated in FIGS. 5–7 does not require a springs 45 to keep lip 34 against wall 22, because the construction and arrangement of front and rear slots 31 and 67 in front and rear end plates 65, in combination with front and rear hanger pins 30 and 68, dictate that lip 34 remains against wall 22.

Figure 8:
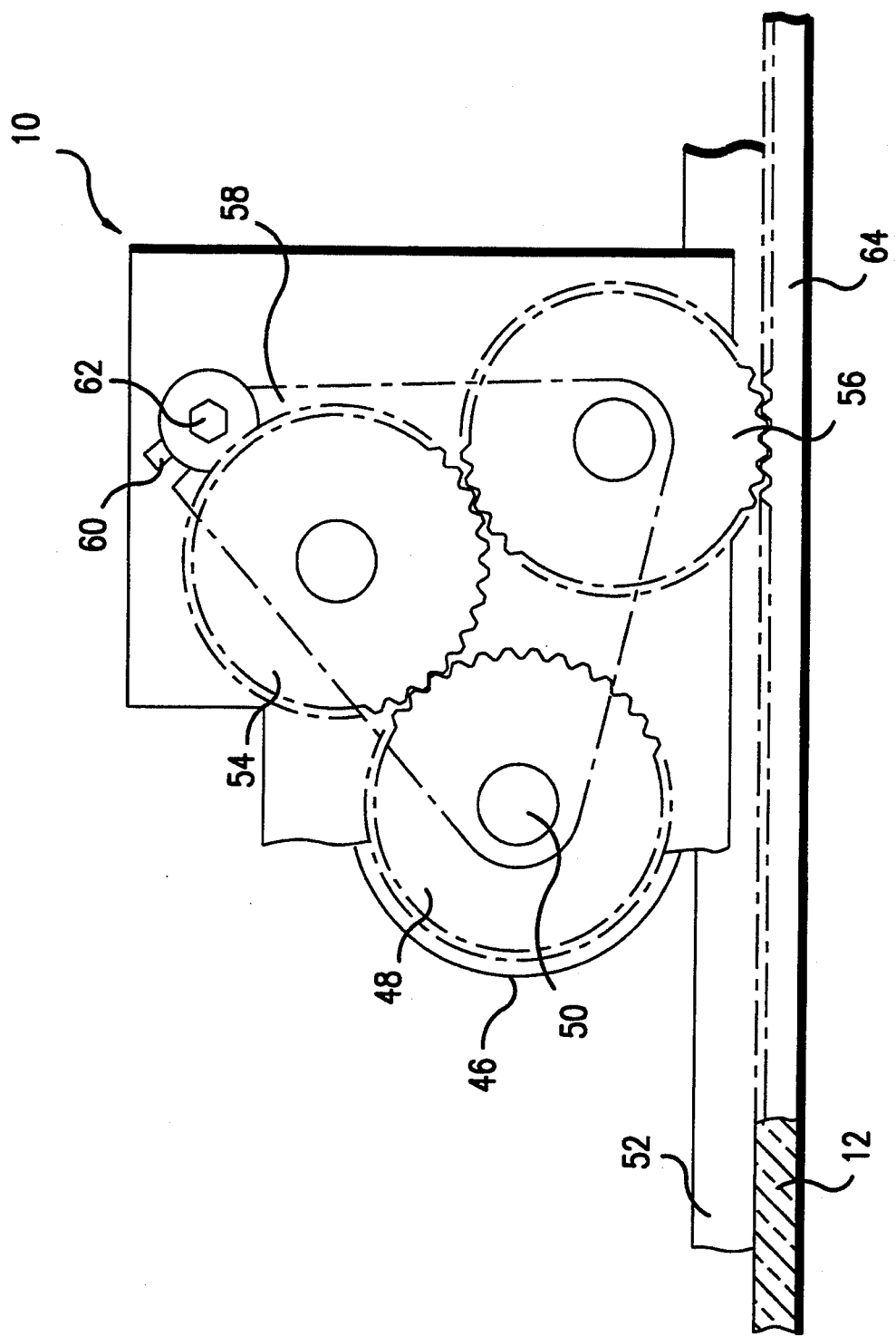
FIG. 8 illustrates a partial cross-sectional end view of a back side of a portion of the preferred photopolymer platemaking apparatus illustrated in FIG. 1.

FIG. 8 illustrates a partial cross-sectional end view of the back side of the apparatus illustrated in FIG. 1, and could also represent a partial cross-sectional back side view of the apparatus illustrated in FIGS. 5–7. Press roller 46 is rotatably connected to the carriage assembly 10, and presses backing sheet 20 (see FIG. 1) over and onto doctored photosensitive liquid resin layer 36' (also illustrated in FIG. 1) at a predetermined height. Press roller 46 is driven by gear 48 which is interconnected to press roller 46 by shaft 50. The height of press roller 46 with respect to horizontal flat plate 12 is determined by the height (i.e., thickness) of shim 52 on which press roller 46 rides. Shims of various thicknesses may be substituted for shim 52, depending upon the thickness of the photopolymer plate desired. Gear 48, in turn, is driven by idler gear 54, which, in turn, is driven by driving pinion 56. Gear 48, idler gear 54, and driving pinion 56, are all rotatably mounted on vertically adjustable plate 58 which pivots about shaft 50. Plate 58 contains slot 60 through which attachment means in the form of the shank of a bolt 62 is inserted when bolt 62 is threaded into the body of the carriage.

The height of the entire carriage assembly 10 is determined by the height of press roller 46, which, in turn, is determined by the thickness of shim 52. Once the thickness of shim 52, and thus the height of press roller 46, is determined, plate 58 may be rotated to engage driving pinion 56 with rack 64 positioned along and beside flat plate 12.

Shims such as shim 52 can be obtained from The L. S. Starrett Co., of Athol, Me., and are called "feeler stock", and are available in thicknesses of at least from about 0.001 inch to 0.030 inch. Drive means (e.g., an electric motor, not illustrated) rotates driving pinion 56 to move the carriage assembly 10 back and forth along the rack 64.

A supplemental, symmetrical driving pinion, idler gear, gear, rack and plate (all not illustrated) may be mounted on the other end of the carriage assembly 10. Driving pinion 56 and rack 64 (along with the symmetrical components, not illustrated) insure uniform movement of the carriage assembly 10 as it traverses the horizontal flat plate 12 to produce a photopolymer plate. The driving pinion, idler gear, gear and rack and their symmetrical counterparts, if desired, comprise the vertically adjustable gear means that drives the carriage.

In the first embodiment described above, the maximum width of a gap between lip 34 and substantially vertical wall 22 is determined by the location of front and rear tilt stop pins 33, which trailing bucket wall 37 of bucket 24 contacts when tilting bucket 24 is tilted from the upright position to the pre-pouring position illustrated in FIG. 4. In the second embodiment, the maximum width of the gap is determined by the location of the ends of the traverse slots.

It can be appreciated that to produce printing plates of uniform thickness, the width of the gap 44 can be variably controlled while traversing horizontal flat plate 12 to provide a uniform flow of photosensitive liquid resin 18 onto an upper surface of cover film 16. The width of the gap 44 may be increased while traversing horizontal flat plate 12 to compensate for the pouring flow rate decrease caused by decreasing head pressure. Various preferred gap widths, for various printing plate thicknesses are discussed above.

In addition, precise control of the width of gap 44 allows manufacture of both thick and thin plates as well as any thickness therebetween.

It is also important to note that the tilting bucket assembly of the present invention can be closed and reopened while the carriage traverses the flat surface. This is important when making a partial photopolymer printing plate, or more than one photopolymer printing plate in a line, i.e., photosensitive liquid resin may be conserved by tilting the bucket from the pre-pouring position to the pouring position, followed by moving the bucket from the pouring position to the post-pouring position.

The photosensitive liquid resins which can be utilized in the apparatus and process according to the present invention include the photosensitive liquid resins which are known to those of skill in the art of making photopolymeric printing plates. More particularly, such photosensitive liquid resins are disclosed in MILLER, et al. '164, AKAMATSU, et al. '887. Japanese Patent Publication No. 19125/1968, U.S. Pat. No. 4,266,007 (HUGHES et al. '007), U.S. Pat. No. 3,687,785 (AKAMATSU et al. '785), and U.S. Pat. No. 4,137,081 (POHL '081), as disclosing resins useful in the process and apparatus of the present invention. Each of these patents and patent publications is hereby incorporated, in its entirety, by reference thereto.

In general, the photosensitive liquid resins, useful in the apparatus and process of the present invention, have a viscosity of from about 1 to 100,000 centipoise, more preferably from about 100 to 50,000 centipoise, and still more preferably, from about 1000 to 30,000 centipoise.

The photosensitive liquid resin described above may be used alone or in conjunction with any one or more additives selected from a group consisting of antioxidants, accelerators, dyes, inhibitors, activators, fillers, pigments, antistatic agents, flame retardant agents thickeners, thixotropic agents, surface active agents, surface treating agents, stabilizers, light scattering agents, viscosity modifiers, etc. Such additives are disclosed in YONEKURA, et al. '998, the disclosure of which is incorporated, in its entirety, by reference thereto, and in MILLER et al. '164.

The photocuring reaction initiator which can be utilized in the apparatus and process according to the present invention includes the photocuring reaction initiators which are known to those of skill in the art of making photopolymeric printing plates. More particularly, such photocuring reaction initiators as are disclosed in MILLER et al. '164, YONEKURA, et al. '998, can be utilized in the apparatus and process of the present invention.

The solvents which can be employed in developing a relief image in the process according to the present invention include solvents known to those of skill in the art of making photopolymeric printing plates. More particularly, such solvents include those disclosed in MILLER, et al. '164, and YONEKURA, et al. '998, can be utilized in the apparatus and process of the present invention.

The backing sheet which can be employed in developing a photopolymeric printing plate using the apparatus and process according to the present invention include those backing sheet materials known to those of skill in the art of making photopolymeric printing plates. More particularly, such backing sheets materials include those disclosed in U.S. Pat. No. 4,070,110 (OTT '110), which is hereby incorporated, in its entirety, by reference thereto, as well as in MILLER et al. '164, and YONEKURA, et al. '998.

The cover film which can be employed in the process of the present invention includes those cover films known to those of skill in the art of making photopolymeric printing plates. More particularly, such backing sheets materials include those disclosed in YONEKURA et al. '998.

The actinic light source which can be employed in developing a photopolymeric printing plate using the apparatus and process according to the present invention include those actinic light sources known to those of skill in the art of making photopolymeric printing plates. More particularly, such actinic light sources include those disclosed in U.S. Pat. No. 4,087,182 (AIBA et al. '182), the disclosure of which is hereby incorporated, in its entirety, by reference thereto, as well as in YONEKURA et al. '998.

In general, actinic radiation of a wavelength of from about 2,000 to 8,000 angstroms can be used. Preferably, the actinic radiation has one or more wavelengths within a range of from about 3,000 to 4,000 angstroms, still more preferably from about 3,500 to 3,700 angstroms. Practical sources of such actinic radiation include carbon arc lamps, super high pressure mercury lamps, high pressure mercury lamps, low pressure mercury lamps, xenon lamps, and ultraviolet fluorescent lamps.

The photo transparency 14 which can be employed in developing a photopolymeric printing plate using the apparatus and process according to the present invention, include those photo transparencies known to those of skill in the art of making photopolymeric printing plates.

Finally, although the invention has been described with reference of particular means, materials and embodiments, it is to be understood that the invention is not limited to the particulars disclosed, and extends to all equivalents within the scope of the claims, without departing from the scope of the invention.

What is claimed is:

1. A tilting bucket assembly, comprising:
   a tilting bucket having a lip thereon;
   a substantially vertical wall associated with said tilting bucket;
   positioning means for maintaining said lip in contact with said substantially vertical wall during tilting of said tilting bucket from an upright position to a pre-pouring position, and for separating said lip from said substantially vertical wall as said tilting bucket tilts from said pre-pouring position to a pouring position.

2. The tilting bucket assembly according to claim 1, wherein said positioning means additionally moves said tilting bucket from said pouring position to a post-pouring position, and from said post-pouring position to said upright position, and maintains said lip in contact with said substantially vertical wall during movement of said tilting bucket from said post-pouring position to said upright position.

3. The tilting bucket assembly according to claim 2, wherein said substantially vertical wall has a lower edge which serves as a doctor blade.

4. The tilting bucket assembly according to claim 2, further comprising means for controlling a rate of pouring of a liquid resin from said tilting bucket, so that a uniform flow of the liquid resin can be provided on a surface of a film.

5. The tilting bucket assembly according to claim 2, wherein said tilting bucket is moveable laterally towards and away from said substantially vertical wall.

6. The tilting bucket assembly according to claim 2, wherein at the pouring position there is a gap between said lip and said substantially vertical wall of from about 0.02 inch to 2 inches.

7. The tilting bucket assembly according to claim 6, wherein at the pouring position there is a gap between said lip and said substantially vertical wall of from about 0.1 inch to 1 inch.

8. The tilting bucket assembly according to claim 7, wherein at the pouring position there is a gap between said lip and said substantially vertical wall of from about 0.2 inch to 0.3 inch.

9. The tilting bucket assembly according to claim 7, wherein at the pouring position there is a gap between said lip and said substantially vertical wall of from about 0.4 inch to 0.8 inch.

10. The tilting bucket assembly according to claim 2, wherein said means for maintaining said lip in contact with said substantially vertical wall during tilting, for separating said lip from said substantially vertical wall, and for maintaining said lip in contact with said substantially vertical wall during moving, comprise a hanger assembly comprising a pair of side plates comprising opposing traverse slots, a pair of opposing, outwardly extending traverse hanger pins, each of said traverse slots having one of said pair of opposing hanger pins positioned therein, each of said side plates further comprising a pair of inwardly extending stop pins, and a spring biasing said lip against said substantially vertical wall.

11. The tilting bucket assembly according to claim 2, wherein said means for maintaining said lip in contact with said substantially vertical wall during tilting, for separating said lip from said substantially vertical wall, and for maintaining said lip in contact with said substantially vertical wall during moving, comprise a hanger assembly comprising a pair of side plates each comprising two traverse slots, and two pairs of opposing, outwardly extending traverse hanger pins on said tilting bucket, each of said traverse slots having a traverse hanger pin positioned therein.

12. A photopolymer platemaking apparatus, comprising a tilting bucket assembly according to claim 2, further comprising a horizontal flat plate and a press roll.

13. The photopolymer platemaking apparatus according to claim 12, further comprising:
a photo transparency on said flat plate;
a cover film on said photo transparency;
a movable carriage for traversing said flat plate, said tilting bucket assembly being mounted on said movable carriage assembly;
means for rolling a backing sheet into a photosensitive liquid resin layer;
said press roll being mounted on said carriage assembly; and
said substantially vertical wall being mounted on said carriage assembly, said substantially vertical wall having a lower edge serving as a doctor blade.

14. The photopolymer platemaking apparatus according to claim 13, wherein said positioning means for maintaining said lip in contact with said substantially vertical wall during tilting, for separating said lip from said substantially vertical wall, and for maintaining said lip in contact with said substantially vertical wall during moving, comprises a hanger assembly comprising a pair of side plates comprising opposing traverse slots, each of said traverse slots having a traverse hanger pin positioned therein, each of said side plates further comprising a pair of inwardly extending stop pins, and a pair of opposing, outwardly extending traverse hanger pins, and a spring biasing said lip against said substantially vertical wall.

15. The photopolymer platemaking apparatus according to claim 14, further comprising:

means for controlling the speed of movement and the amount of movement of said lip with respect to said substantially vertical wall, for controlling a gap between said lip and said substantially vertical wall, so that said gap provides uniform flow of a photosensitive liquid resin onto a surface of said cover film, and a lower edge of said substantially vertical wall doctors said photosensitive liquid resin to a substantially uniform thickness before an application of said backing sheet to said photosensitive liquid resin;
a shim above at least a portion of said flat plate, said press roll riding on said shim, a height of said press roll from said flat plate being determined by the thickness of said shim; and
means for driving said carriage, comprising gearing connected to said press roll and said flat plate, pivotally mounted to said carriage, and vertically adjustable for a height of said press roll from said flat plate.

16. The photopolymer platemaking apparatus according to claim 13, wherein:
said positioning means for maintaining said lip in contact with said substantially vertical wall during tilting, for separating said lip from said substantially vertical wall, and for maintaining said lip in contact with said substantially vertical wall during moving, comprise a hanger assembly comprising a pair of side plates each comprising two traverse slots, and two pairs of opposing, outwardly extending traverse hanger pins on said tilting bucket, each of said traverse slots having a traverse hanger pin positioned therein.

17. The photopolymer platemaking apparatus according to claim 16, further comprising means for controlling the speed of movement and the amount of movement of said lip with respect to said substantially vertical wall, and for controlling a gap between said lip and said substantially vertical wall, so that said gap provides uniform flow of a photosensitive liquid resin onto a surface of said cover film, and a lower edge of said substantially vertical wall doctors said photosensitive liquid resin to a substantially uniform thickness before an application of said backing sheet to said photosensitive liquid resin;
a shim above at least a portion of said flat plate, said press roll riding on said shim, a height of said press roll from said flat plate being determined by the thickness of said shim; and
means for driving said carriage, comprising gearing connected to said press roll and said flat plate, pivotally mounted to said carriage, and vertically adjustable for a height of said press roll from said flat plate.

18. A process for preparing a photopolymeric printing plate from a photosensitive liquid resin, comprising:
tilting a tilting bucket containing the photosensitive liquid resin, said tilting bucket having a lip thereon, while maintaining said lip in contact with a substantially vertical wall during tilting of said tilting bucket from an upright position to a pre-pouring position;
separating said lip from said substantially vertical wall as said tilting bucket is further tilted from said pre-pouring position to a pouring position; and
maintaining said tilting bucket in said pouring position during pouring of the photosensitive liquid resin onto a supporting surface.

19. The process according to claim 18, further comprising:
   moving said tilting bucket from said pouring position to a post-pouring position; and
   moving said tilting bucket from said post-pouring position to said upright position while said lip remains in contact with said substantially vertical wall.

20. The process according to claim 19, further comprising:
   doctoring said photosensitive liquid resin on said supporting surface using a predetermined clearance from said supporting surface, to produce a doctored photosensitive liquid resin layer;
   laminating a backing sheet onto said doctored resin layer to form an assembly of said backing sheet and said doctored photosensitive liquid resin layer;
   exposing said assembly to actinic radiation through an image-bearing transparency, so that exposed portions of said photosensitive liquid resin layer are polymerized; and
   removing non-exposed, unpolymerized portions of said layer of photosensitive material, to form relief images on said backing material.

21. The process according to claim 19, wherein said tilting bucket assembly supplies said photosensitive liquid resin over said supporting surface without substantial bubble formation in said photosensitive liquid resin.

22. The process according to claim 21, wherein said moving of said tilting bucket from said post-pouring position to said upright position recaptures at least 60% of an amount of said photosensitive liquid resin remaining on said substantially vertical wall after said photosensitive liquid resin is supplied over said supporting surface.

23. The process according to claim 22, wherein said moving of said tilting bucket from said post-pouring position to said upright position recaptures at least 80% of an amount of said photosensitive liquid resin remaining on said substantially vertical wall after said photosensitive liquid resin is supplied over said supporting surface.

24. The process according to claim 23, wherein said moving of said tilting bucket from said post-pouring position to said upright position recaptures at least 90% of an amount of said photosensitive liquid resin remaining on said substantially vertical wall after said photosensitive liquid resin is supplied over said supporting surface.

25. The process according to claim 19, wherein said substantially vertical wall has a lower edge serving as a doctor blade.

26. The process according to claim 19, further comprising controlling the rate of supplying said photosensitive liquid resin from said tilting bucket, so that a uniform flow of said resin is provided on a surface of a cover film.

27. The process according to claim 19, wherein said tilting bucket is moveable laterally towards and away from said substantially vertical wall while said tilting bucket is tilted and is moved.

28. The process according to claim 19, wherein said lid of said tilting bucket separates from said substantially vertical wall to produce a gap of from about 0.02 inch to 2 inches, as said tilting bucket tilts from said pre-pouring position to said pouring position.

29. The process according to claim 28, wherein said lip of said tilting bucket separates from said substantially vertical wall to produce a gap of from about 0.1 inch to 1 inch, as said tilting bucket tilts from said pre-pouring position to said pouring position.

30. The process according to claim 29, wherein said lip of said tilting bucket separates from said substantially vertical wall to produce a gap of from about 0.2 inch to 0.3 inch, as said tilting bucket tilts from said pre-pouring position to said pouring position.

31. The process according to claim 29, wherein said lid of said tilting bucket separates from said substantially vertical wall to produce a gap of from about 0.4 inch to 0.8 inch, as said tilting bucket tilts from said pre-pouring position to said pouring position.

32. The process according to claim 19, further comprising tilting said tilting bucket from said upright position to said pre-pouring position while maintaining said lip in contact with said substantially vertical wall, separating said lip from said substantially vertical wall as said tilting bucket is further tilted from said pre-pouring position to said pouring position, maintaining said tilting bucket in said pouring position, moving said tilting bucket from said pouring position to said post-pouring position, and maintaining said lip in contact with said substantially vertical wall during moving said tilting bucket from said post-pouring position to said upright position, including the use of:
   a hanger assembly comprising a pair of side plates comprising opposing traverse slots, each of said side plates further comprising a pair of inwardly extending stop pins, and a pair of opposing, outwardly extending traverse hanger pins on said tilting bucket, each of said traverse slots having a traverse hanger pin positioned therein, and a spring biasing said lip against said substantially vertical wall.

33. The process according to claim 19, further comprising tilting said tilting bucket from said upright position to said pre-pouring position while maintaining said lip in contact with said substantially vertical wall, separating said lip from said substantially vertical wall as said tilting bucket is further tilted from said pre-pouring position to said pouring position, maintaining said tilting bucket in said pouring position, moving said tilting bucket from said pouring position to said post-pouring position, and maintaining said lip in contact with said substantially vertical wall during moving said tilting bucket from said post-pouring position to said upright position, including the use of:
   a hanger assembly comprising a pair of side plates each comprising two traverse slots, and two pairs of opposing, outwardly extending traverse hanger pins, each of said traverse slots having a traverse hanger pin positioned therein.

34. The process according to claim 20, wherein said process is performed using a photopolymer platemaking apparatus comprising a horizontal flat plate, and a carriage assembly comprising said tilting bucket, said substantially vertical wall having a lower edge serving as a doctor blade, a press roll, and means for rolling a backing sheet into the photosensitive liquid resin.

35. The process according to claim 34, wherein said photopolymer platemaking apparatus further comprises a photo transparency on said flat plate, and a cover film on said photo transparency, a shim above at least a portion of said flat plate, said press roll riding on said shim, a height of said press roll from said flat plate being determined by the thickness of said shim, and means for driving said carriage, comprising gearing connected to said press roll and said flat plate, pivotally mounted to said carriage, and vertically adjustable for a height of said press roll from said flat plate.

* * * * *

UNITED STATES PATENT AND TRADEMARK OFFICE
CERTIFICATE OF CORRECTION

PATENT NO.   : 5,348,605
DATED        : September 20, 1994
INVENTOR(S)  : Norman E. Hughes and Richard B. Schroeder It is certified that error appears in the above-indentified patent and that said Letters Patent is hereby corrected as shown below:

Claim 31, column 16, line 9, change "lid of" to -- lip of --.

Signed and Sealed this

Twenty-second Day of November, 1994

Attest:

BRUCE LEHMAN

Attesting Officer

Commissioner of Patents and Trademarks